United States Patent [19]
Shufflebotham et al.

[11] Patent Number: 5,503,676
[45] Date of Patent: Apr. 2, 1996

[54] APPARATUS AND METHOD FOR MAGNETRON IN-SITU CLEANING OF PLASMA REACTION CHAMBER

[75] Inventors: Paul K. Shufflebotham, Fremont; Larry D. Hartsough, Berkeley; Dean R. Denison, San Jose, all of Calif.

[73] Assignee: Lam Research Corporation, Fremont, Calif.

[21] Appl. No.: 385,202

[22] Filed: Feb. 8, 1995

Related U.S. Application Data

[63] Continuation of Ser. No. 308,341, Sep. 19, 1994, abandoned.

[51] Int. Cl.$^6$ .......................... C23C 16/00; H01L 21/306
[52] U.S. Cl. ...................... 118/723 MR; 156/345.643.1; 156/646.1; 118/719; 213/1; 204/298.37
[58] Field of Search .................. 118/723 MR, 723 MA, 118/723 E, 719; 156/345, 643.1, 646.1; 134/1; 204/298.37

[56] References Cited

U.S. PATENT DOCUMENTS

| | | | |
|---|---|---|---|
| 4,401,054 | 8/1983 | Matsuo et al. | 118/723 |
| 4,434,038 | 2/1984 | Morrison, Jr. | 204/192 R |
| 4,576,698 | 3/1986 | Gallagher et al. | 204/192 E |
| 4,588,490 | 5/1986 | Cuomo et al. | 204/298 |
| 4,657,616 | 4/1987 | Benzing et al. | 156/345 |
| 4,786,352 | 11/1988 | Benzing | 156/345 |
| 4,948,458 | 8/1990 | Ogle | 156/643 |
| 5,158,644 | 10/1992 | Cheung et al. | 156/643 |
| 5,198,725 | 3/1993 | Chen et al. | 315/111.41 |
| 5,200,232 | 4/1993 | Tappan et al. | 118/723 X |
| 5,211,825 | 5/1993 | Saito et al. | 134/1 X |

*Primary Examiner*—R. Bruce Breneman
*Assistant Examiner*—Joni Y. Chang
*Attorney, Agent, or Firm*—Burns, Doane, Swecker & Mathis

[57] ABSTRACT

A method and apparatus for removing extraneous deposits from particle control surfaces in a microwave plasma generating device. An annular magnetron plasma is formed in contact with a particle control surface having a shape which intersects 200–500 G lines of magnetic induction. The magnetron plasma is scanned across particle control surfaces on a horn and chuck by increasing the current to the main coil and/or mirror coil of the apparatus. As the magnetron plasma moves across the particle control surfaces, the plasma reacts with the extraneous deposits and etches the deposits off of the particle control surfaces.

24 Claims, 6 Drawing Sheets

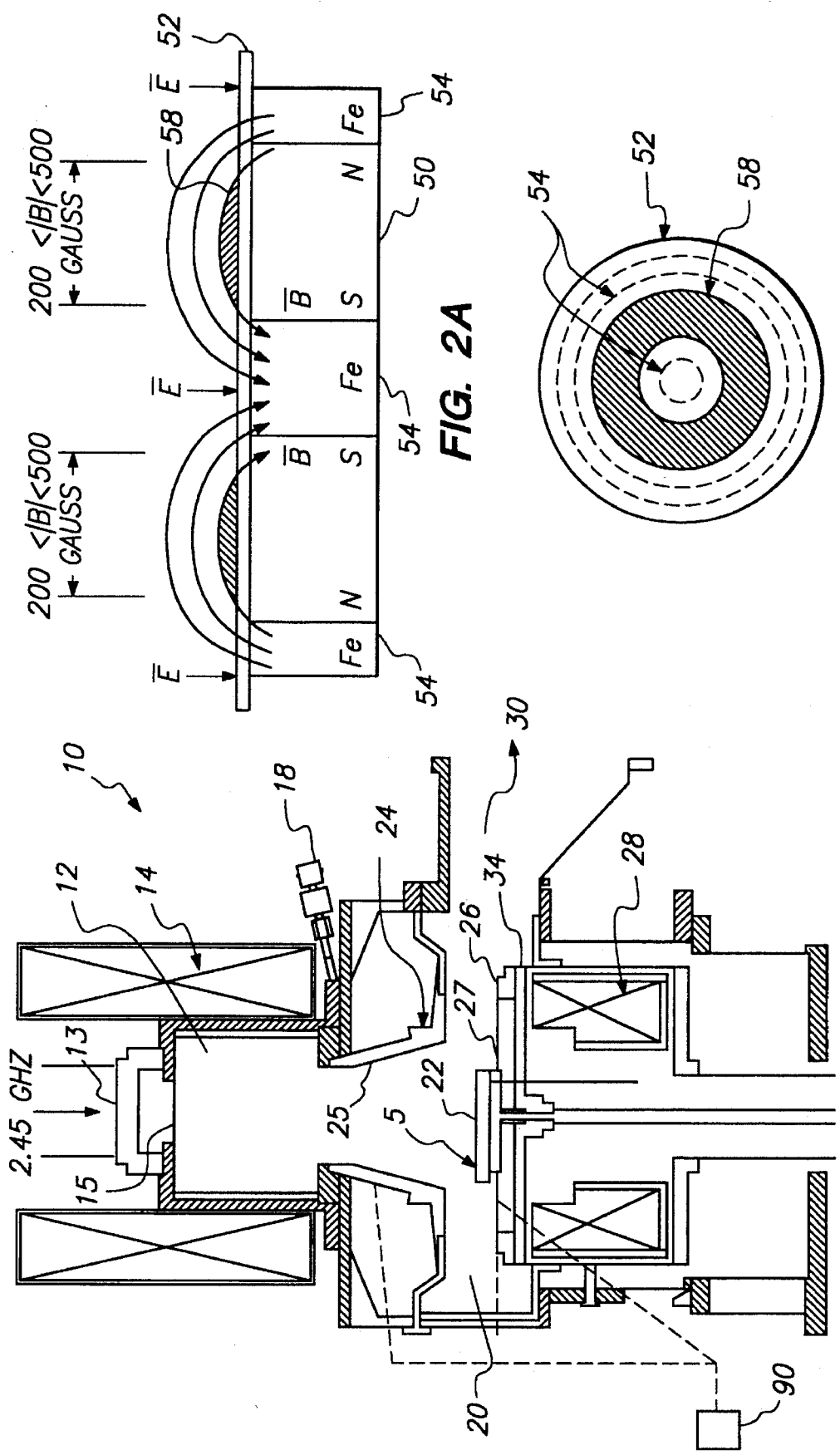

5,503,676

APPARATUS AND METHOD FOR MAGNETRON IN-SITU CLEANING OF PLASMA REACTION CHAMBER

This application is a continuation of application Ser. No. 08/308,341, filed Sep. 19, 1994, now abandoned.

FIELD OF THE INVENTION

The present invention relates to a reaction chamber design and a method for forming a magnetron plasma in a plasma generating device for removing deposits from the internal surfaces of the plasma generating device.

BACKGROUND OF THE INVENTION

CVD apparatus is conventionally used to form various thin films in a semiconductor integrated circuit. Such CVD apparatus can form thin films such as $SiO_2$, $Si_3N_4$, Si or the like with high purity and high quality. In the reaction process of forming a thin film, a reaction vessel in which semiconductor substrates are arranged can be heated to a high temperature condition of 500° to 1000° C. Raw material to be deposited can be supplied through the vessel in the form of gaseous constituents so that gaseous molecules are thermally disassociated and combined in the gas and on the surface of the specimen so as to form a thin film.

A plasma enhanced CVD apparatus utilizes a plasma reaction to create a reaction similar to that of the above-described CVD apparatus but at a relatively low temperature in order to form a thin film. The plasma CVD apparatus includes a specimen chamber, a gas introduction system, and an exhaust system. For example, a plasma enhanced CVD apparatus is disclosed in U.S. Pat. No. 4,401,504. Plasma is generated in such an apparatus by microwave discharge through electron-cyclotron resonance (ECR). A specimen table is provided in the specimen chamber, and plasma generated in the plasma formation chamber passes through a plasma extracting orifice so as to form a plasma stream in the specimen chamber. The specimen table may have a cooling mechanism in order to prevent a rise in temperature of the specimen due to the plasma action.

During electron-cyclotron resonance chemical vapor deposition of $SiO_2$, extraneous $SiO_x$ film deposits on various surfaces throughout the reaction chamber. As these deposits become thicker, they begin to crack, flake and spall, thus generating particles within the reaction chamber that contaminate wafers processed in the reactor.

U.S. Pat. No. 5,200,232 discloses a reaction chamber designed to minimize particle generation in a plasma enhanced chemical vapor deposition reactor, the disclosure of which is incorporated herein by reference. Specifically, all surfaces near or within a line-of-sight path to the wafer are replaced with, or shielded by, particle control surfaces. These surfaces are temperature controlled to prevent thermal cycling from occurring in the extraneous deposits, since thermal expansion and contraction produces mechanical stresses that result in cracking and delamination, thus generating particles. The surfaces are also designed so that no sharp edges or corners occur which might concentrate mechanical stresses, and thus act as a catalyst for particle generation. Also, in the case of $SiO_2$ deposition, the particle control surface is constructed out of aluminum, to which extraneous $SiO_x$ adheres very well. This combination of temperature and adherence control effectively eliminates particle generation, at least until the extraneous film becomes so thick that intrinsic material stresses overcome the adhesion strength, and particle generation begins to occur.

In conventional systems, when particle generation begins, the particle control surfaces must be removed and replaced with new or cleaned parts. The cleaning process typically involves a carbide bead-blasting procedure, or machining with a lathe. The regular removal of particle control hardware is undesirable for several reasons. Most importantly, the reaction chamber must be opened to the atmosphere and subjected to human handling and mechanical operations. This invariably results in significant particle contamination. Furthermore, each hardware change requires trained technicians to perform the change, and to ensure compliance with cleanliness and safety regulations. In addition, the trained technicians must requalify the safety and functioning of the tool. This is both an expensive and a time-consuming process. Furthermore, the downtime required for the change adversely affects the tool throughput, which increases production costs. Additional costs result from the fact that the particle control hardware is a consumable item and several sets must be available to be cycled through after the cleaning steps. Finally, any mechanical cleaning will eventually wear out the parts, thus necessitating regular replacement. Thus, there exists a need in the art for improving the methods for removing extraneous film buildup on surfaces in the reaction chamber, especially line-of-sight surfaces and specimen surrounding surfaces. The term "line-of-sight surfaces" as used herein means surfaces from which a straight line can be drawn directly to a specimen mounted in the reaction chamber. The term "specimen surrounding surfaces" as used herein means surfaces surrounding the specimen mounted in the reaction chamber and which are directly contacted by a plasma stream. The term "specimen" as used herein means any semiconductor substrate, such as a wafer of silicon or other material, having a flat or uneven surfaces onto which a film is formed by a plasma reaction.

It is known in the art to use a magnetron plasma device for deposition/etching of a target or samples on the target, as disclosed in U.S. Pat. No. 4,588,490. Also, use of a magnetron plasma to clean interior surfaces of a chamber is disclosed in U.S. Pat. No. 4,434,038.

SUMMARY OF THE DISCLOSURE

One objective of the present invention is to increase the operational lifetime of the particle control surfaces in a reaction chamber. The present invention accomplishes this objective by using an in-situ cleaning procedure to remove the extraneous deposits collected by the particle control hardware, where the reaction chamber does not have to be opened, and no parts need to be removed. The invention is intended to perform this task in a timely, efficient manner, without contaminating or damaging the particle control surfaces in any way which would inhibit their ability to perform their intended function.

The present invention accomplishes these tasks by applying direct current ("DC") power or radiofrequency ("RF") power to the particle control surfaces and generating a localized magnetron plasma on the particle control surfaces using a gas which will produce plasma-enhanced chemical etching of the extraneous deposits. The particle control surfaces are shaped such that lines of magnetic induction pass into and out of each surface. When an electric field is applied to the particle control surfaces electrons become trapped in the crossed electric and magnetic fields. This results in the formation of a localized magnetron plasma in the annular region between where the lines of induction enter and exit the surface. By changing the current supplied to one or more electromagnet coils of the plasma device, an annular magnetron plasma can be swept across the surface to provide in-situ cleaning of the reaction chamber.

According to one embodiment of the present invention, a plasma generating device comprises a plasma chamber for generating plasma, a reaction chamber having a specimen stage on which a specimen can be treated with the plasma, and a gas supply means for supplying gas to the plasma generating chamber. In addition, the plasma generating device includes one or more radiofrequency or direct current power supplies connected to the particle control surfaces and at least one electromagnetic coil for generating a magnetic field in the reaction chamber and producing an annular region of a magnetron plasma on one or more particle control surfaces in the reaction chamber. Finally, the device includes current supply means for supplying the electromagnet with an adjustable amount of current so that the annular magnetron plasma can be confined and scanned over the particle control surface in the reaction chamber to etch and remove deposits from the particle control surface.

In accordance with one embodiment of the present invention, the magnetic field generating means comprises a main coil surrounding the plasma chamber and a mirror coil surrounding the reaction chamber. The mirror coil includes an inner coil, an outer coil and an iron core therebetween. Separate current sources supply direct current to the main coil, the outer coil and the inner coil, respectively.

According to another embodiment of the present invention, the present invention relates to a method for removing extraneous deposits from a plasma generating device. According to the method, a gas is introduced into a plasma generating chamber, a magnetron plasma is generated on a particle control surface in the reaction chamber and the magnetron plasma is confined and scanned over the particle control surface in the reaction chamber so as to etch and remove deposits from the surface.

BRIEF DESCRIPTION OF THE DRAWINGS

The invention will now be described with reference to the accompanying drawings, in which:

FIG. 1 illustrates one embodiment of a plasma enhanced CVD apparatus in accordance with the present invention;

FIGS. 2(a)–(b) illustrate a side and top view of the formation of magnetron plasma;

DETAILED DESCRIPTION OF THE PREFERRED EMBODIMENTS

Figure 3A:
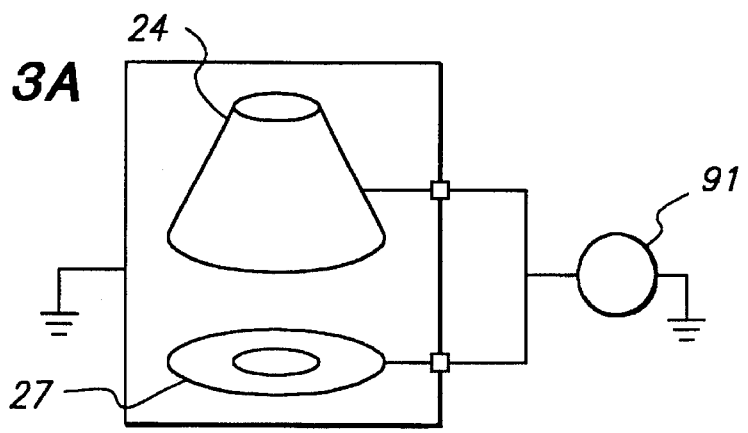
FIGS. 3(a)–(c) illustrate various ways in which the particle control surfaces can be electrically biased.

The present invention relates to a method and apparatus for removing particle build-up from particle control surfaces in a plasma generating device such as an electron-cyclotron resonance chemical vapor deposition (ECR-CVD) reactor.

FIG. 1 illustrates a plasma generating device 10 according to one embodiment of the present invention. As shown, a treated surface S of a semiconductor specimen 22 is held in a horizontal orientation on a specimen-supporting surface 34 in a reaction chamber 20. The specimen supporting surface 34 is movable in a vertical direction toward and away from a plasma generating chamber 12. Plasma is generated in the plasma chamber 12 by a microwave discharge through electron cyclotron resonance and depending on the gases introduced into the device, wafer processing treatments such as etching or deposition treatments can be carried out on the specimen. For instance, the plasma generating chamber 12 and the reaction chamber 20 are typically evacuated via vacuum port 30, one or more gases are fed into the plasma generating chamber 12 through a gas feeding pipe 18, an electromagnet 14 creates a magnetic field within the apparatus, a microwave is introduced into the plasma generating chamber 12 through a waveguide 13 and a microwave feeding window 15 and plasma is formed as a result of the resonance excitation initiated in the gas inside the plasma generating chamber 12 which acts as a microwave resonant cavity. Plasma generated in the plasma chamber 12 passes through an aperture in a plasma aperture ring and forms a plasma reaction region adjacent the specimen-supporting surface 34. Electromagnet 28 located below chuck 26 aids in treatment of the specimen surface S.

During operation of plasma generating devices, by-product deposits can build up on various surfaces throughout the reaction chamber. For instance, during deposition of $SiO_2$, extraneous $SiO_x$ films can be formed. Also, depending on the etching/deposition treatments, electrically conductive metals such as aluminum, titanium and tungsten can be deposited on interior surfaces of the reaction chamber. According to the invention, such deposits can be removed from particle control surfaces in the reaction chamber by means of a localized magnetron plasma which is swept over the particle control surfaces.

According to the present invention, extraneous deposits on particle control surfaces are etched away by an annular magnetron plasma which is swept over the surfaces in a controlled manner. A magnetron plasma can be generated in a reactant gas which is introduced into the reaction chamber. The reactant gas chemistry depends on the residue/deposits to be removed. For instance, a fluorine containing gas can be used to remove silicon, silicon oxide, silicon nitride and metal deposits such as tungsten; a chlorine-containing gas can be used to remove metal deposits such as tungsten, aluminum, titanium and molybdenum; and an oxygen-containing gas can be used to remove organic deposits by converting the solid residues into gaseous form. Further details of techniques for removing residues in plasma reactors are disclosed in copending and commonly assigned U.S. Pat. Ser. No. 08/176,935, the disclosure of which is hereby incorporated by reference.

According to the present invention, the particle control surfaces to be etched are connected to means 90 for applying an electrical bias to such surfaces. For instance, an electrical power supply generating a direct current bias, connected to an electrically conductive particle control surface, can be used to form a DC magnetron plasma. Alternatively, an electrical power supply generating an RF bias can be used to form an RF magnetron plasma. Radiofrequencies of 400 kHz or 13.56 MHz could be used to form the RF magnetron plasma. The particle control surfaces should be electrically conductive and electrically isolated from the remainder of the reaction/plasma chamber. However, the surfaces of the particle control surfaces may be coated with an etch-proof material and the coating may be electrically conductive or non-conductive.

When a magnetron plasma is generated using an RF power supply, a blocking capacitor can be placed between the particle control surface to be etched and the RF power supply in order to prevent DC current flow that would tend to destabilize an RF magnetron plasma by draining it of charge. In addition, the blocking capacitor promotes a self-bias on the etched surface which enhances etch rate by accelerating positive ions into energetic bombardment of the surface. In addition to the blocking capacitor, an impedance matching network can be electrically connected between the blocking capacitor and the RF power supply in order to couple the maximum possible power from the RF power supply to the load, and to prevent damage to the RF power supply.

In one embodiment of the present invention, an RF power supply, impedance matching network and blocking capacitor are connected in series to each surface to be etched. In another embodiment of the present invention, a single RF power supply is electrically connected to a split-phase impedance matching network which is connected through blocking capacitors to two surfaces to be etched. Any suitable split-phase impedance matching network can be used such as the Rainbow 17400 available from Lam Research Corporation. This split-phase impedance matching network provides RF biases, 180 degrees out of phase, to the two surfaces to be etched.

FIGS. 2a–b are used to explain how a magnetron plasma can be formed. It should be understood, however, that it is not necessary to use the particular technique shown in FIGS. 2a–b in forming a localized magnetron plasma in accordance with the invention. As shown in FIGS. 2a–b, an annular area of a magnetron plasma can be formed when a surface to be cleaned is given an electrical bias and magnetic lines of induction exit and enter the biased surface in such a manner as to form a closed "tunnel" or a "racetrack". In FIG. 2a, a circular electromagnet 50 is positioned below an electrically biased surface 52. A plurality of iron pieces 54 are positioned around the electromagnet 50 to control the shape of the magnetic lines of induction B generated by the electromagnet 50. In addition, additional coils or even permanent magnets can also be used to shape the magnetic field. The magnetic field is preferably configured to be perpendicular to the electric field at the center of the racetrack, as illustrated in FIG. 2a. Preferably, the magnetic field in the racetrack region is in the range of 200–500 Gauss, so as to confine the magnetron plasma 58 to the racetrack 56. As illustrated in FIG. 2a, the magnetic lines of induction exit and enter the biased surface 52 which causes the created magnetron plasma 58 to be confined to the racetrack 56 so that the plasma 58 is in contact with the biased surface 52. The plasma 58 is thus confined so that it does not occur where it is not needed. This improves the efficiency, speed and process control, while minimizing the possibility of damage to other reaction chamber parts.

In one embodiment of the present invention, particle control surfaces such as a horn 24 and specimen surrounding surface 27 are electrically insulated and given an RF bias. In addition, the surfaces are specifically shaped to fit the magnetic field produced by the main coil 14 and the mirror coil 28. For instance, horn 24 has a shape such that the 200–500 G configured magnetic field forms an annular magnetron plasma on a surface 25 of the horn facing substrate 22. Also, substrate holder or chuck 26 includes the specimen surrounding surface 27 on which the 200–500 G configured magnetic field forms another annular magnetron plasma. Thus, simply by shaping the surfaces 25, 27 to fit the magnetic field in the manner indicated above, annular zones of magnetron plasma can be created on the surfaces 25, 27 without adding auxiliary equipment such as coils, magnets, iron pieces, etc. to the plasma reactor inside or outside the plasma and reaction chambers (i.e., the existing electromagnets of the plasma reactor can be used to generate and sweep the magnetron plasma across the particle control surfaces). If desired, however, such auxiliary equipment could be added to a plasma reactor to accomplish the objectives of the invention.

Figure 3B:
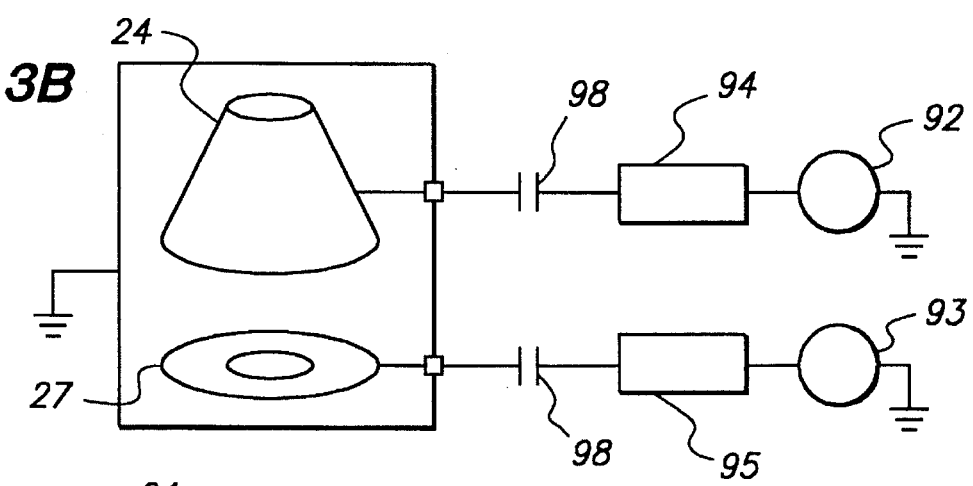
Figure 3C:
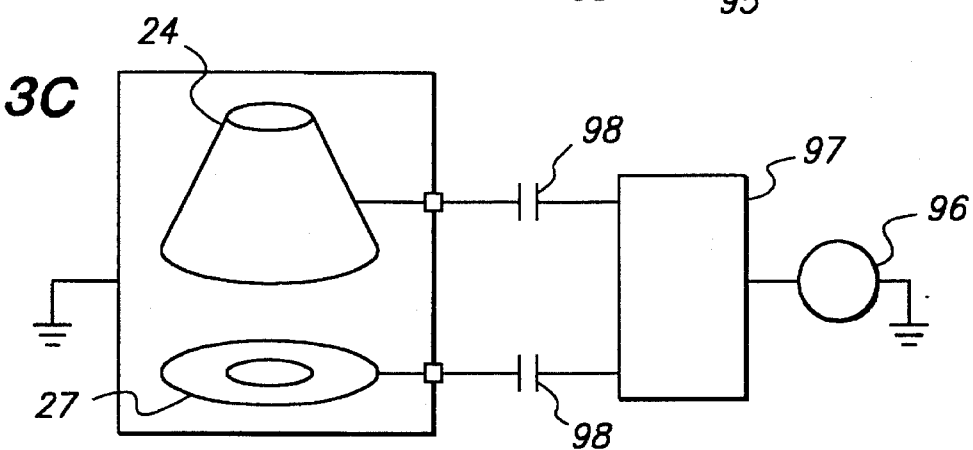
Figure 4A:
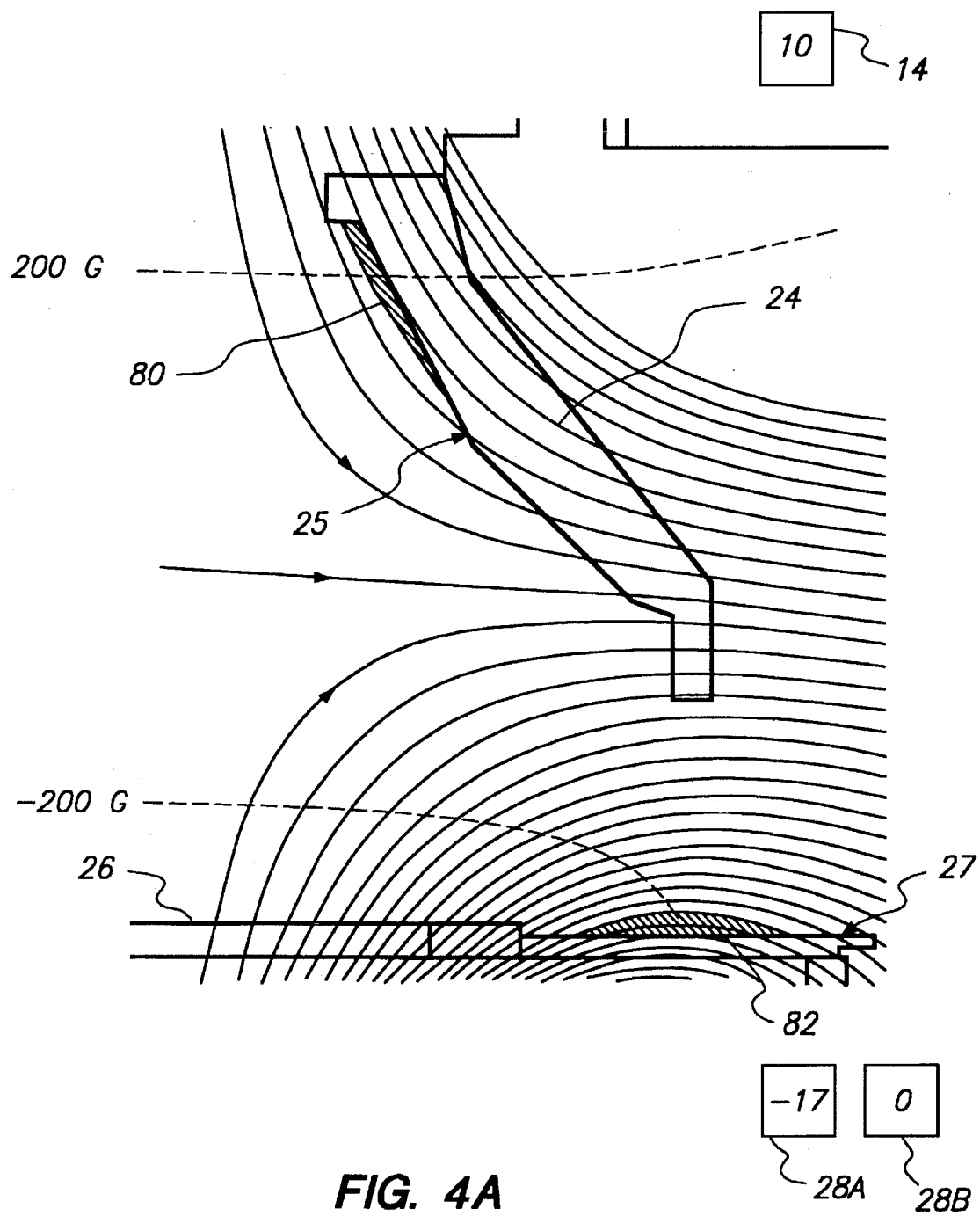
FIGS. 4(a)–(d) illustrate how a magnetron plasma can be scanned across particle control surfaces.
Figure 4B:
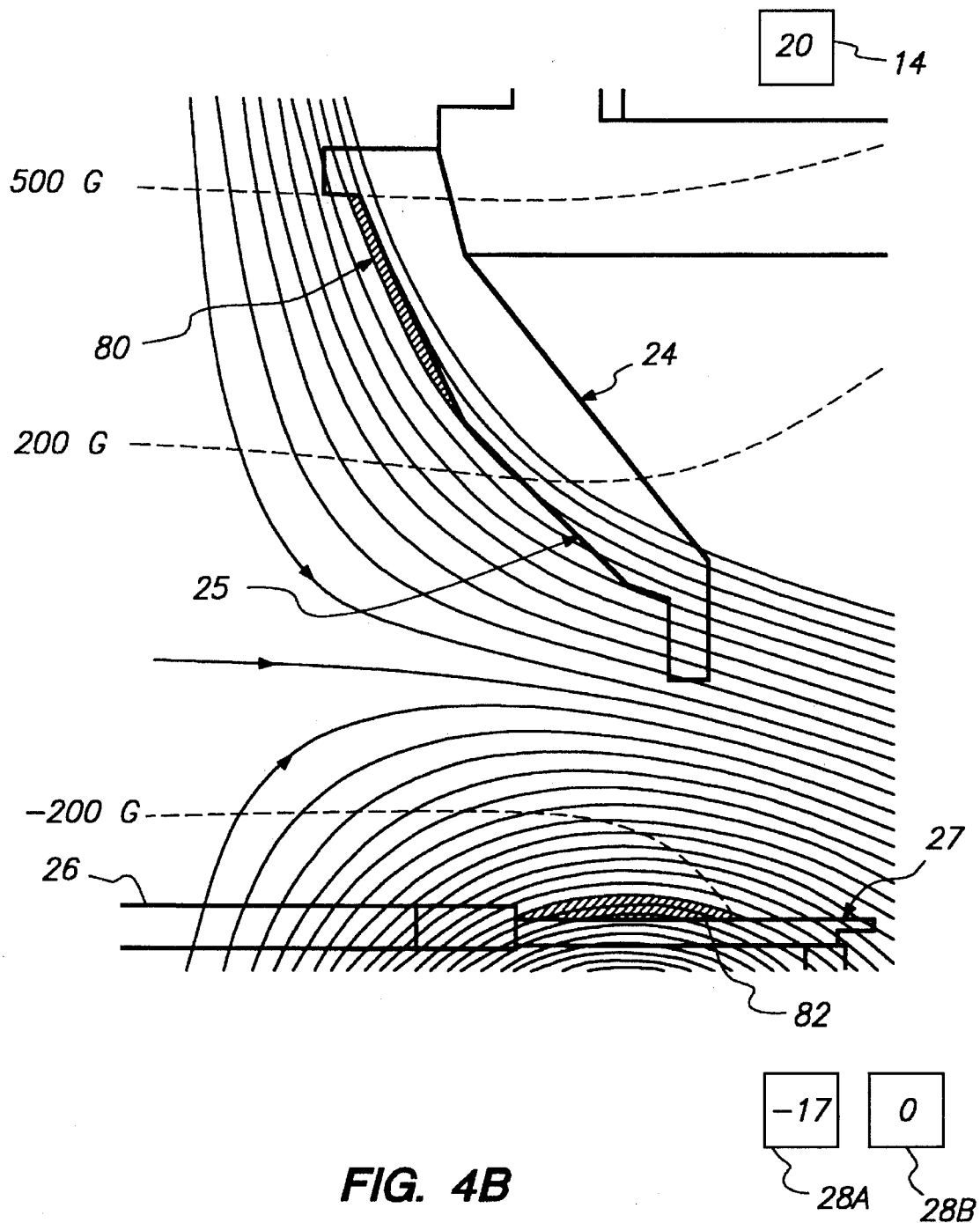
Figure 4C:
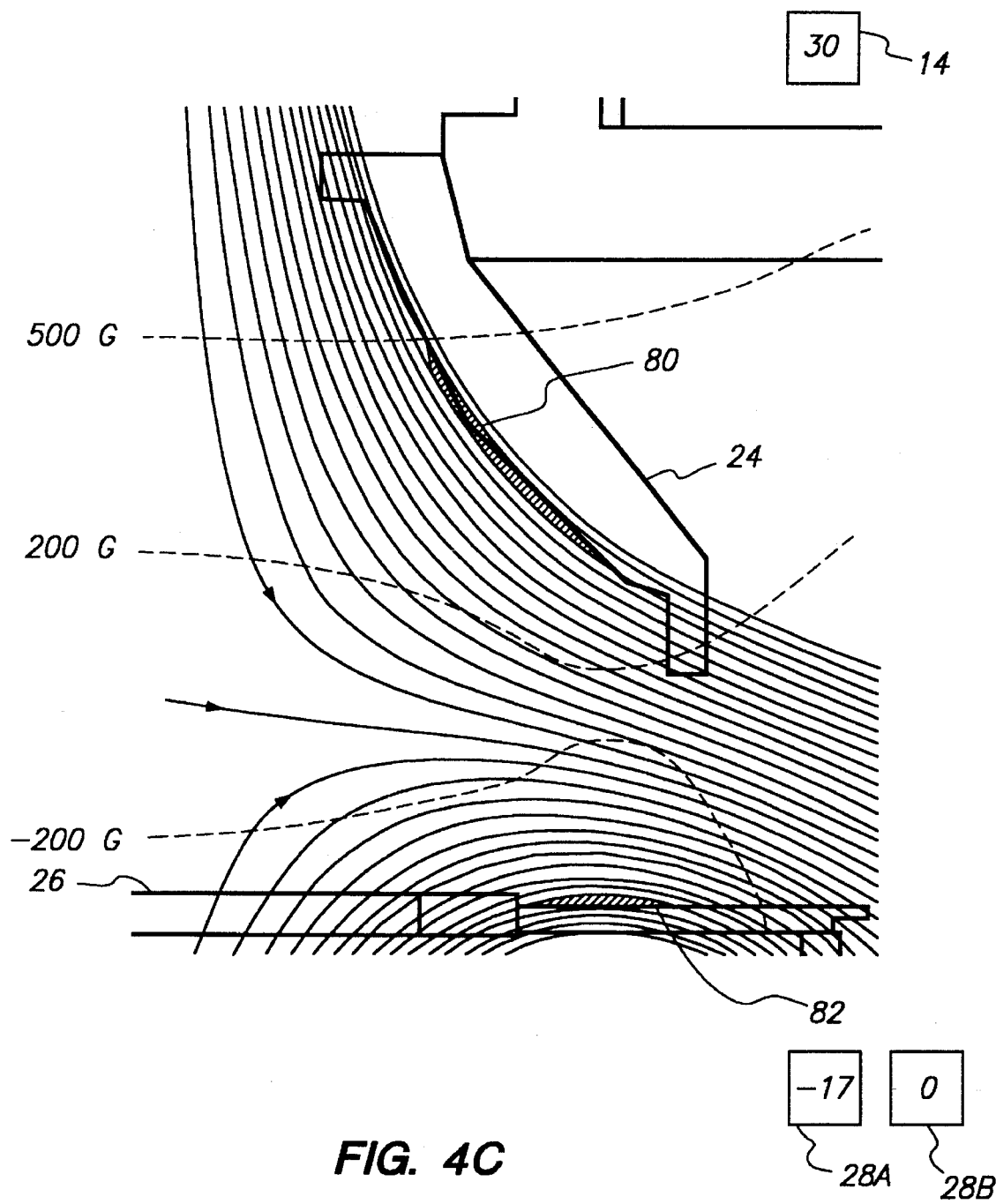
Figure 4D:
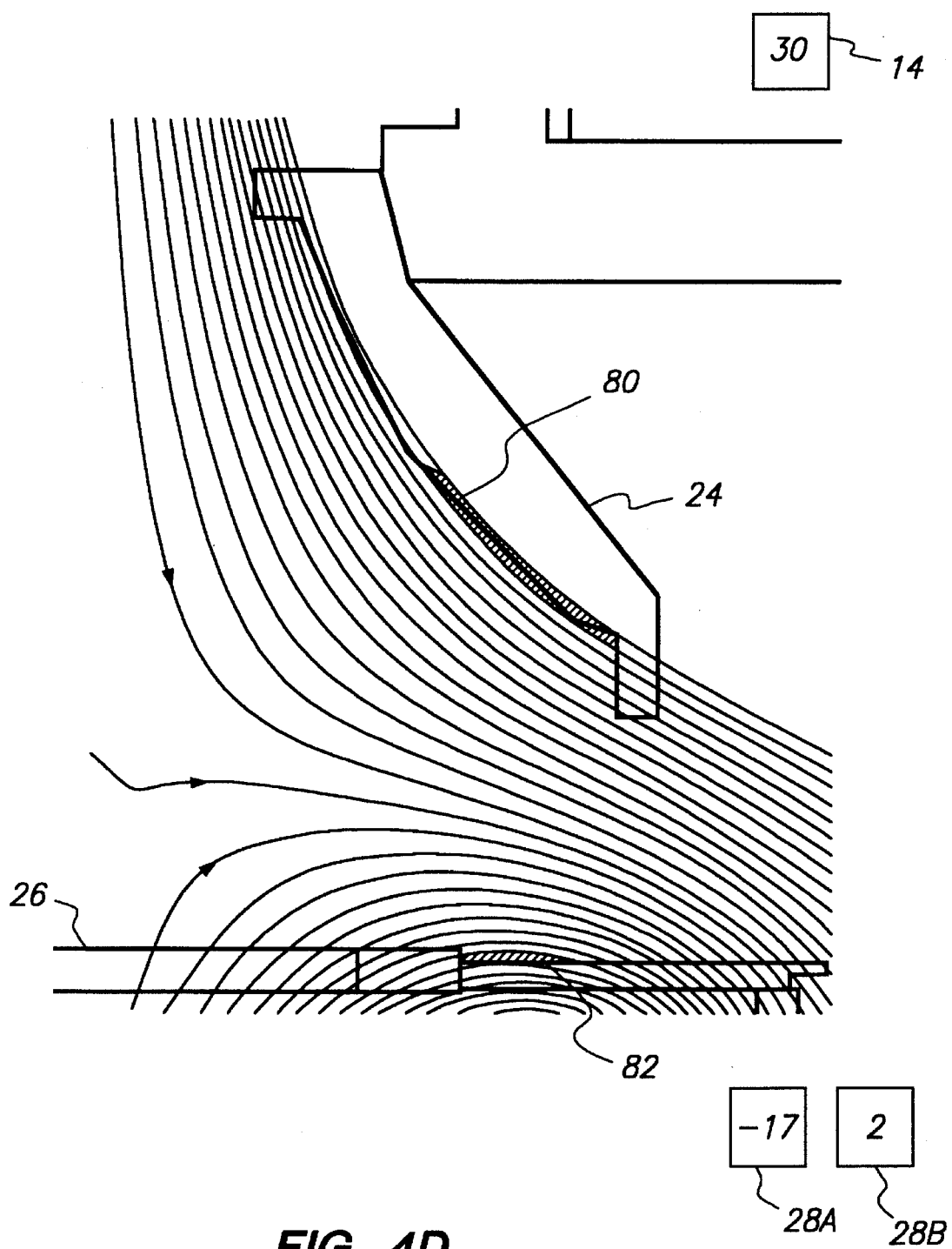

The electrical biasing means 90 is further explained with reference to FIGS. 3(a)–(c). FIG. 3(a) shows an embodiment in which the plasma can be generated using a direct current power supply 91. FIGS. 3(b)–(c) show embodiments in which the particle control surfaces are coated with an insulating coating thus requiting use of RF power to bias the particle control surfaces. In this case, the horn 24 and specimen surround surface 27 can be powered separately by RF generators 92 and 93, matching networks 94 and 95 and blocking capacitors 98, as shown in FIG. 3(b), or together using a RF generator 96, a split phase match 97 and blocking capacitors 98 as shown in FIG. 3(c).

In FIG. 3(b), each particle control surface and corresponding magnetron plasma is an RF load, and has an impedance which depends on the size/geometry of the particle control surface and the chamber, and the properties of the magnetron plasma. This load impedance must be matched to the standard impedance of the RF generator. The match must, of course, be compatible with the RF frequency and power used, as well as the load impedance range. The match must have, either built-in or added to its output, a DC blocking capacitor to allow the particle control surface to acquire a DC self-bias voltage from the magnetron plasma. This is needed for plasma stability, where excess DC current now would tend to "drain" the plasma of charge and for enhancing the etch rate of the particle control surface as a result of the self-bias voltage accelerating positive ions into energetic bombardment of the surface.

With respect to FIG. 3(c), the split-phase match allows both parts to be powered simultaneously with a single match and generator. In this case, the match contains DC paths to ground and an external capacitor must be added at its output to perform the DC blocking function. With respect to the RF frequency, 400 kHz is desired since lower frequencies tend to produce higher energy ion bombardment, and thus a higher etch rate. Other frequencies, such as 13.56 MHz could be used instead, or even at the same time, on different particle control surfaces.

According to one embodiment of the invention, the magnetron plasma can be swept downwardly along surface 25 and inwardly across surface 27 simply by increasing direct current supplied to main coil 14. As the magnetron plasma moves across the particle control surfaces 25, 27, the plasma reacts with any extraneous deposits and volatilizes the deposits on the particle control surfaces. This process is illustrated in FIGS. 4(a)–(d). In FIGS. 4(a)–(d), a magnetron plasma is formed on the horn 24 and the chuck 26. By varying the current supplied to the electromagnet 14, the magnetron plasma 80 can be moved downwardly across the surface 25 of the horn 24 while the magnetron plasma 82 is moved inwardly across surface 27 of chuck 26. Further, in FIG. 4(d) the magnetron plasma 82 can be moved to a radially innermost position on surface 27 of chuck 26 by adding a small amount of current to the outer coil of the electromagnet 28.

It will be understood by those skilled in the art that the method according to the invention can be carried out with a plurality of electromagnets. For example, according to one embodiment of the present invention, a plurality of electromagnets can be placed around the reaction chamber and the plasma chamber of a microwave plasma generating device. As illustrated in FIG. 1, two concentric electromagnets 14 and 28 are used to generate the magnetron plasma. It should be noted that it is not necessary to supply any microwave energy when the magnetron plasma is formed (i.e., the magnetron plasma can be formed simply by supplying an RF or DC bias to surfaces 25 and 27 and creating a magnetic field with electromagnets 14 and 28). In this configuration, the magnetron plasma will be confined to two annular racetracks which can be scanned back and forth across the particle control surfaces 25, 27, respectively, to etch away any extraneous deposits by varying the direct current supplied to at least one of the electromagnets.

According to the invention, a localized magnetron plasma can be formed on the horn 24 by supplying a direct current to the coil of electromagnet 14. By changing the amount of current supplied to electromagnet 14, the magnetron plasma can then be scanned across the surface 25 of horn 24 to etch away any extraneous deposits. At the same time, the chuck 26 can also be cleaned by forming a magnetron plasma on the chuck 26 with or without changing the current supplied to the electromagnet 28. The magnetron plasma is preferably scanned across surface 27 of the chuck 26 to etch away any extraneous deposits at the same time the magnetron plasma is scanned across surface 25. That is, by simply changing the amount of current supplied to coil 14, the 200–500 G lines of magnetic induction entering and exiting the particle control surfaces 25, 27 can be shifted to thereby sweep the magnetron plasma across those surfaces.

In-situ cleaning of particle control surfaces 25, 27 can be carried out as follows. The particle control surfaces 25, 27 can be given an RF bias by means of a radiofrequency energy source supplying RF energy at 400 kHz. As shown in FIG. 3a, the main coil 14 can be supplied with a direct current of +10 amps, the inner coil 28a of coil 28 can be supplied with a direct current of −17 amps and the outer coil 28b of coil 28 can be turned off whereby a first annular magnetron plasma 80 is produced at a radially innermost part of surface 25 and a second annular magnetron plasma 82 is produced at a radially outermost part of surface 27. As shown in FIG. 3b, as power to coil 14 is increased from +10 amps to +20 amps, the annular magnetron plasma 80 moves radially outwardly along surface 25 and the annular magnetron plasma 82 moves radially inwardly along surface 27. As shown in FIG. 3c, the annular magnetron plasmas 80, 82 are moved further by increasing power to coil 14 from +20 to +30 amps. As shown in FIG. 3d, the annular magnetron plasmas 80, 82 can be moved even further by supplying a small amount (i.e. +2 amps) to outer coil 28b. Thus, by varying the amounts and/or polarity of currents supplied to coils 14, 28a and/or 28b, the magnetron plasma can be scanned across the particle control surfaces.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A plasma generating device capable of in-situ removal of residues in a plasma reaction chamber in the device, comprising:

a reaction chamber having a specimen stage on which a specimen can be treated with the plasma;

gas supply means for supplying gas to the reaction chamber;

electromagnet means comprising at least one electromagnet coil for generating a magnetic field in the reaction chamber, the magnetic field being capable of producing a magnetron plasma;

at least one particle control surface having a shape which intersects lines of magnetic induction created by the electromagnet means sufficient to create a localized magnetron plasma;

means for applying an electrical bias to the particle control surface; and current supply means for supplying the electromagnet means with an adjustable amount of direct electrical current so that an annular magnetron plasma is formed in contact with the particle control surface and the annular magnetron plasma can be swept across the particle control surface to remove deposits from the particle control surface.

2. The plasma generating device according to claim 1, further comprising a plasma generating chamber and means for generating a microwave electric field in the plasma generating chamber.

3. The plasma generating device according to claim 1, wherein the at least one particle control surface has a shape which intersects 200–500 G lines of magnetic induction created by the electromagnet means.

4. The plasma generating device according to claim 1, wherein said particle control surface is on a horn in the reaction chamber.

5. The plasma generating device according to claim 1, wherein said particle control surface is on a specimen support in the reaction chamber.

6. The plasma generating device according to claim 1, wherein the electromagnet means comprises a main coil surrounding a plasma chamber of the device and a mirror coil surrounding the reaction chamber.

7. The plasma generating device according to claim 6, wherein the mirror coil includes inner and outer coils and an iron core therebetween.

8. The plasma generating device of claim 7, wherein the current supply means provides an independently adjustable amount of current to the main coil, the inner coil and the outer coil.

9. A plasma generating device of claim 1, wherein the particle control surface comprises a conical surface.

10. A plasma generating device of claim 1, wherein the particle control surface is planar and surrounds the specimen stage.

11. The plasma generating device of claim 1, wherein the device includes a plasma generating chamber and means for generating a microwave electric field in the plasma chamber, the at least one particle control surface comprising a surface of a horn extending from an outlet of the plasma chamber into the reaction chamber and a surface of a chuck on which the specimen stage is located.

12. A method for removing extraneous deposits from a plasma generating device, the device including a reaction chamber, a substrate holder in the reaction chamber for supporting a specimen to be treated by plasma, electromagnet means comprising at least one electromagnet, at least one particle control surface having a shape which intersects lines of magnetic induction created by the electromagnet means, a current supply means for supplying the electromagnet means with an adjustable amount of direct electrical current so that an annular magnetron plasma is formed in contact with the particle control surface and the annular magnetron plasma can be swept across the particle control surface, and a means for applying an electrical bias to the particle control surface to be swept by the magnetron plasma, the method comprising the steps of:

introducing reactant gas into the reaction chamber;

applying an electrical bias to the particle control surface;

supplying a first amount of direct current to the electromagnet so as to form an annular magnetron plasma in contact with the particle control surface; and varying the amount of direct current supplied to the electromagnet such that the annular magnetron plasma moves across and removes deposits on the particle control surface.

13. The method according to claim 12, wherein the step of biasing the particle control surface is carried out by applying direct current to the particle control surface and forming a DC magnetron plasma.

14. The method according to claim 13, wherein the extraneous deposits include at least one electrically conductive metal.

15. The method according to claim 12, wherein the step of biasing the particle control surface is carried out by applying radiofrequency current to the particle control surface and forming a RF magnetron plasma.

16. The method according to claim 15, wherein the extraneous deposit includes $SiO_x$ and the reactant gas comprises a fluorine-containing gas.

17. The method according to claim 16, wherein the reactant gas comprises $NF_3$.

18. The method according to claim 12, wherein the device includes a plasma generating chamber and means for generating a microwave electric field in the plasma generating chamber.

19. The method according to claim 12, wherein at least one particle control surface has a shape which intersects 200–500 G lines of magnetic induction created by the electromagnet means.

20. The method according to claim 12, wherein the particle control surface comprises a generally conical surface.

21. The method according to claim 12, wherein the particle control surface is generally coplanar with, and surrounds, the specimen stage.

22. The method according to claim 12, wherein the device includes a plasma generating chamber, the electromagnet means comprising a main coil surrounding the plasma chamber and a mirror coil surrounding the reaction chamber.

23. The method according to claim 12, wherein the mirror coil includes inner and outer coils and an iron core therebetween.

24. The method according to claim 12, wherein during the step of varying the current to the electromagnet the amount of current supplied to the main coil by current supply means is increased and the annular magnetron plasma moves radially outwardly along the particle control surface.

* * * * *